United States Patent [19]

Nolan

[11] Patent Number: 4,754,407
[45] Date of Patent: Jun. 28, 1988

[54] DIGITAL PHASE SYNCHRONIZER

[75] Inventor: Dennis C. Nolan, West Allis, Wis.
[73] Assignee: MagneTek, Inc., Los Angeles, Calif.
[21] Appl. No.: 888,780
[22] Filed: Jul. 22, 1986
[51] Int. Cl.$^4$ .................. G06F 15/20; G01R 19/00
[52] U.S. Cl. .................................... 364/481; 364/483; 340/661
[58] Field of Search .................. 364/480, 481, 483; 375/118–120; 329/50, 122, 124, 126, 136, 140, 142; 340/657, 658, 825.14, 660, 661; 324/78 D, 83 D

[56] References Cited

U.S. PATENT DOCUMENTS

| | | | |
|---|---|---|---|
| 4,435,425 | 7/1984 | Vollrath | 363/87 |
| 4,462,110 | 7/1984 | Baldwin et al. | 377/43 |
| 4,556,866 | 12/1985 | Gorecki | 340/310 A |
| 4,672,555 | 6/1987 | Hart et al. | 364/483 |

OTHER PUBLICATIONS

Taber, "Digital Phase Error Detector", IBM Technical Disclosure Bulletin, pp. 5171–5173, vol. 23, No. 11, Apr. 1981.
Application Note AP-248 Dec., 1985 "Using the 8096", by Ira Horden, Order No. 270061-001, published by Intel Corp.

Primary Examiner—Parshotam S. Lall
Attorney, Agent, or Firm—Faegre & Benson

[57] ABSTRACT

A method and apparatus for digital phase synchronization to an AC power line is disclosed, having an analog-to-digital conversion providing a digital phase error signal which is processed by an inverting proportional plus integral transfer function and compared to a digital timer to determine the time for the next analog-to-digital conversion.

15 Claims, 3 Drawing Sheets

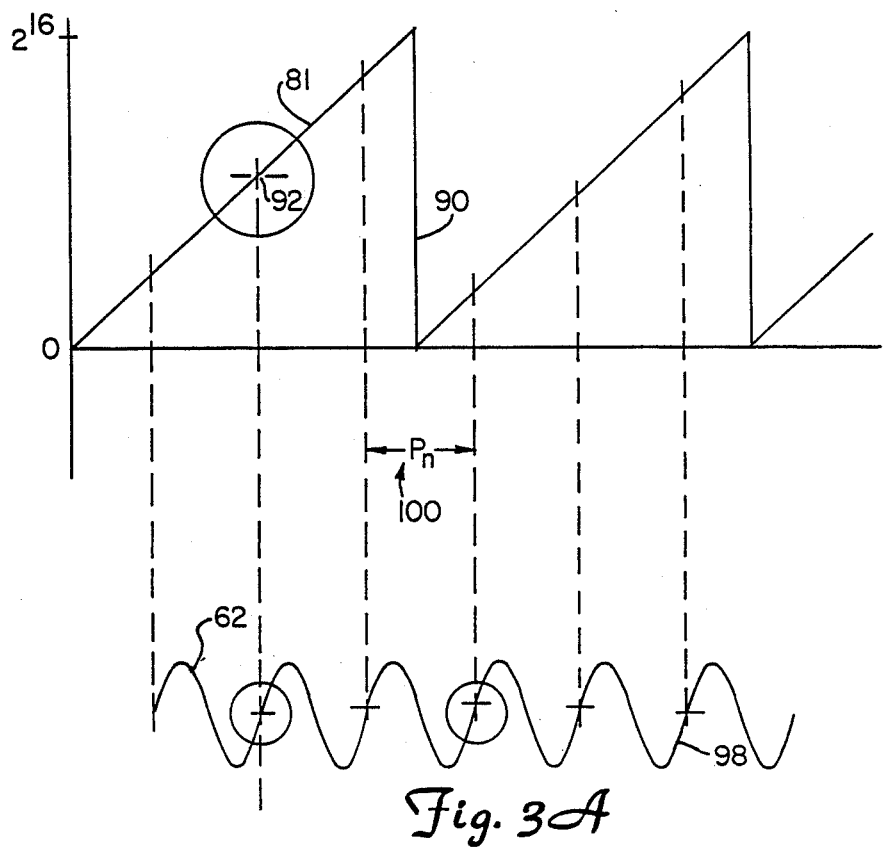
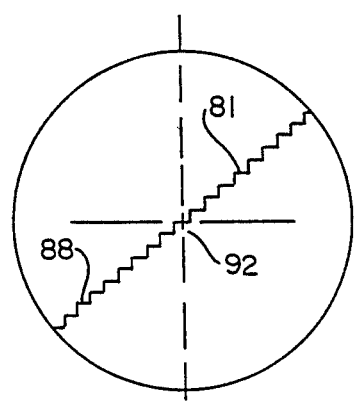
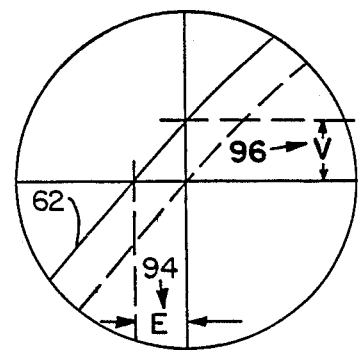
Fig. 3A
Fig. 3B
Fig. 3C

DIGITAL PHASE SYNCHRONIZER

BACKGROUND OF THE INVENTION

In the past it has been found necessary to provide phase synchronization for thyristor bridges operating from AC power lines. The same thyristor power bridges needing such a signal have often been found to be the cause of distortion and noise encountered in AC power lines feeding such bridges. Conventional approaches seeking to achieve high noise immunity encountered phase displacement and thus phase synchronization errors when conventional approaches to phase synchronization were used.

SUMMARY OF THE INVENTION

According to the present invention, digital phase synchronization is provided which avoids errors in prior art solutions to this problem, and in addition minimizes the external circuitry needed to synchronize a microprocessor to an AC power line.

BRIEF SUMMARY OF THE DRAWINGS

FIGS. 3A-C are representative waveforms, and enlarged views of the waveforms pertinent to the present invention.

DETAILED DESCRIPTION

Figure 1:
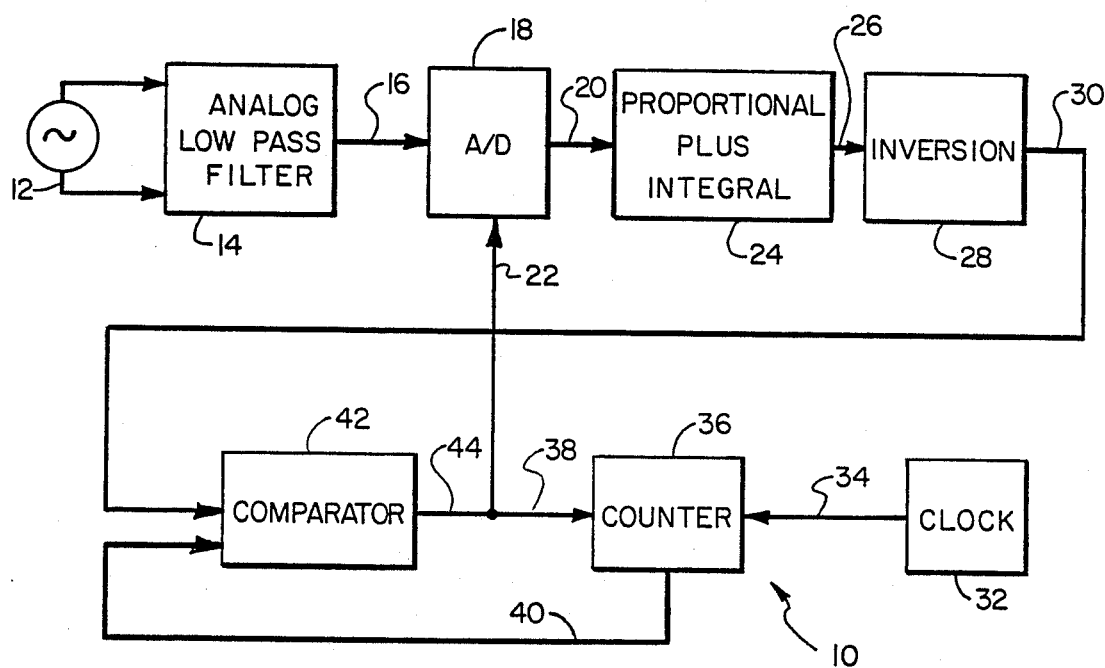
FIG. 1 is a block diagram of a hardware embodiment of the present invention.

Referring to FIG. 1, a digital phase synchronizer 10 is shown in block diagram form. In this embodiment, dedicated hardware is used to provide phase synchronization with an AC power line 12. An analog low pass filter 14 preferably reduces the voltage of and removes noise from the AC line 12 and provides an analog input signal 16 which has a known, constant phase shift and is representative of the AC line. Filter 14 may include a step-down transformer to provide the voltage reduction. Because the phase shift of filter 14 is known and constant it may be removed by subsequent circuitry.

Signal 16 is connected to an analog to digital (A to D) converter 18. More particularly, A to D converter 18 provides a digital output 20 representative of signal 16 at the time a strobe input command 22 is received. Output 20 may be a 16 bit wide word. Alternatively, output 20 may be a serial bit stream, in which case the subsequent circuitry is to be understood as adapted to operate on serial as opposed to parallel digital data.

Under steady state conditions the digital signal 20 is a representation of the measured phase error, E, since the strobe command 22 instructs A to D converter 18 to sample the AC line at or near the zero crossing of waveform 16. The steady state operation makes use of the mathematical relationship $\sin(x) = x$, for small values of x, as will be described in more detail subsequently.

Digital signal 20 is fed to a proportional plus integral digital transfer function block 24. Block or transfer function 24 has a digital output 26, which may be alternatively in parallel or serial form. Output 26 at the n-th strobe command or sample may be represented by $F_n$ and the then current value of the digital phase error signal 20 may be represented by $E_n$. The transfer function of block 24 may be expressed by Equation 1 as follows:

$$F_n = I_{n-1} + K'E_n + K'', \tag{1}$$

where $I_{n-1}$ represents the error integral of digital phase error signals accumulated as of the previous strobe command in the integral portion of transfer function 24. The integral portion of the transfer function is represented by Equation 2 as follows:

$$I_n = I_{n-1} + K_i E_n \tag{2}$$

K' and K'' are scaling constants for equation 1. Transfer function 24 may be broken down into two stages of an integral function followed by a proportional gain term.

The proportional gain term following the integral term may be represented by Equation 3 as follows:

$$F_n = I_n + K_p E_n + K'' \tag{3}$$

where $K_i$ and $K_p$ are the respective integral and proportional gain constants with $K_i + K_p = K'$. K'' is a constant which may be utilized in the transfer function of block 24 to provide an initial starting point for output 26 at or near the expected steady state value. For example, if this invention is to synchronize to nominal 50/60 Hz AC power lines, K'' may be set to represent 55 Hz. This minimizes the "settling time" for output 26 to achieve its steady state value in operation. Block 24 may thus be considered to be a digital accumulator. The proportional and K'' constant terms are not essential to the operation of this invention and thus may be omitted in an alternative embodiment; they have however been found useful in improving the transient performance of this invention and are therefore disclosed herein. Desirable coefficient values for Equations 2 and 3 have been found to be $K_p = 10$, $K_i = 2$, and $K'' = 55$.

Block 28 provides the algebraic inversion or reciprocal of signal 26 at output 30 according to Equation 4:

$$P_n = 1/F_n \tag{4}$$

In this embodiment, signal 26 is a digital representation of a calculated frequency, F, computed by block 24 while signal 30 is a digital representation of a calculated period, $P_n$, which corresponds to the time which should occur between sucessive zero crossings having the same slope.

A constant frequency digital clock 32 feeds a stream of equally spaced pulses on line 34 to a counter 36. Counter 36 is preferably a fixed stage binary counter which would overflow (i.e. from 111 ... 11 to 000 ... 00) and continue counting if not reset. Counter 36 is a resettable counter having a reset input 38 and having a multi-bit digital output 40 of either parallel or serial form, C, consistent with other portions of the synchronizer 10. Counter output 40 and the digitally computed period 30 are presented as inputs to comparator 42. Comparator 42 provides an output 44 upon sensing a match ($C_n = P_n$) between signals 30 and 40. Output 44 is used to command the A to D converter to perform another conversion, and is also used to reset counter 36 through reset input 38. Output 44 preferably provides a pulse, which in the steady state, is coincident with the positive going zero crossing of the AC power line waveform 16 and thus provides digital phase synchronization.

It is to be understood that various combinations of serial and parallel digital circuit operations are contemplated hereunder; for example, comparator 42 may receive serial bit streams at inputs 30 and 40 into M-stage shift registers whose contents are compared in parallel fashion after every M shifts.

Figure 2:
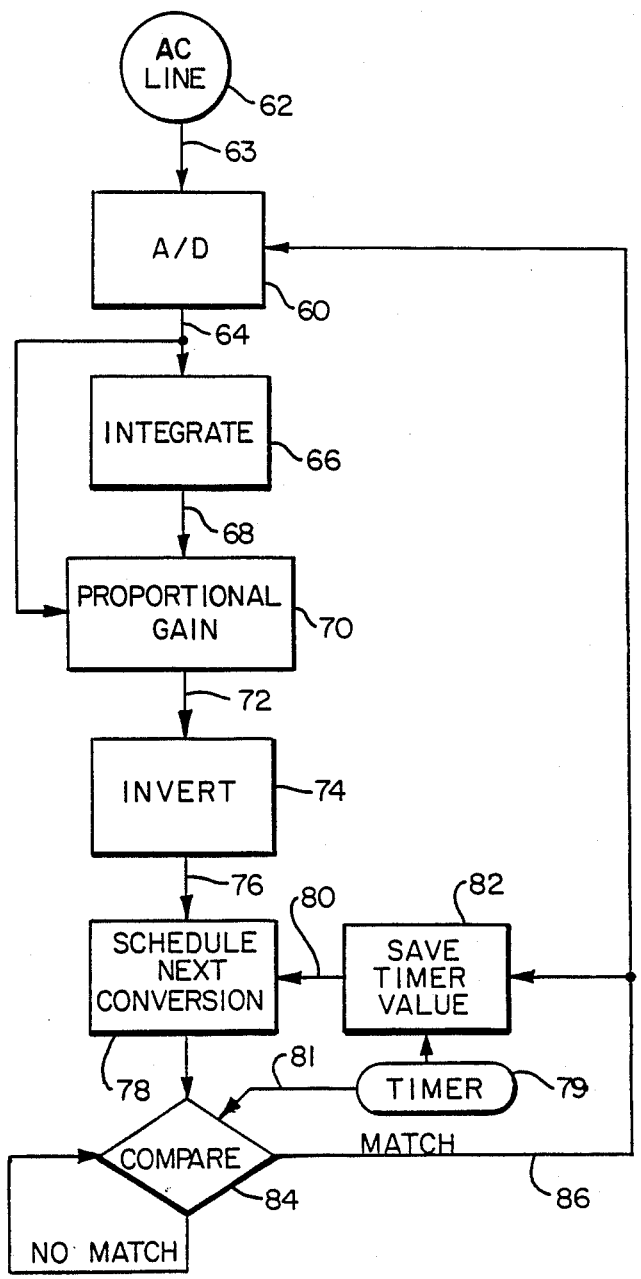
FIG. 2 is a flow diagram of the steps of performing digital phase synchronization of the present invention.

Referring now more particularly to FIG. 2, a preferred embodiment of this invention may be seen in flow diagram form. This embodiment makes use of a microcontroller such as a model 8096 or 8097 microcontroller available from Intel Corporation, 3065 Bowers Avenue, Santa Clara, CA 95051. The Intel application note AP-248 of December, 1985 entitled "Using the 8096" by Ira Horden, Order Number 270061-001 is expressly incorporated by reference herein.

The 8096 microcontroller includes a controllable A to D converter, a central processing unit (CPU) section for performing digital arithmetic and transfer functions, a free running timer, a content addressable memory (CAM) file for storing events scheduled to occur at a specified time, and a comparator for comparing the timer with the CAM scheduled event times. The 8097 has the same features as the 8096. In the 8096 and 8097 when a match occurs between the scheduled time for a specified event and the timer count, the specified event will be triggered or caused to occur.

Referring now more particularly to the flow diagram of FIG. 2, upon a command on line 86 the present value $T_n$ of the timer 79 is saved in block 82 and the A to D converter 60 converts the then present value of the analog voltage level of a signal 63 proportional to an AC line voltage 62 to a parallel digital form at 64. The signal at 64 is the digital phase error signal, E, having a present value $E_n$ and corresponding to signal 20 of the hardware embodiment of the digital phase synchronizer 10. The integration of Equation 2 is performed by accumulating the present and previous values of the digital phase error signal in block 66 according to Equation 2. $I_n$, the digital phase error signal time integral 68 is then combined with $E_n$, the digital phase error signal 64, in a proportional gain transfer function 70 according to Equation 3, performed by the CPU. $F_n$, the digital 16 bit word representative of the computed frequency 72, is algebraically inverted by the CPU according to Equation 4 at block 74 to result in a 16 bit parallel representation $P_n$ of the computed period 76 representative of the incremental time to the next zero crossing with the same slope of the AC line. The computed period $P_n$ is added to the saved value of the timer $T_n$ and stored in the CAM file as the scheduled time $T_{n+1}$ of the next conversion at block 78. In the 8097, the next A to D conversion is the next CAM event to be scheduled according to equation 5:

$$S_{n-1} = T_n + P_n \quad (5)$$

The timer preferably counts the fixed frequency clock pulses of the 8097 microcontroller which are independent of the AC line. As the time continues to run, the internal comparator checks for a match (in Block 84) between the timer and the next conversion event scheduled in the content addressable memory $S_{n+1}$. Once a match occurs ($T_{n+1} = S_{n+1}$), a new command 86 is issued to (again) save the timer value and commence an A to D conversion, and this command is available to other circuitry as a digital signal indicative of every other zero crossing of the AC line.

It is to be understood that the digital phase error processing of FIG. 2 occupies only a small fraction of the time available between every other zero crossing of the AC line and thus the 8097 is free to perform other functions as desired while in the "no match" loops of Block 84.

Referring now more particularly to FIGS. 3A-3C, waveforms for the AC line 62 and the output 81 of timer 79 may be seen. FIGS. 3B and 3C are magnified view of portions of the waveforms of FIG. 3A. Timer 79 is preferably a free-running 16 bit binary counter. In FIG. 3B each step 88 of wave form 81 represents an increment or "tick" of counter 79. Counter 79 overflows from a full count to a zero count on the next successive tick after a full count, shown diagrammically at 90, and in a manner referred to previously in describing counter 36.

Referring now more particularly to the wave form 62 of FIG. 3A, the initial frequency shown is digitally synchronized at count 92 of the timer output 81. Waveform 62 is to be understood as representing a relatively rapid, but brief frequency increase during successive cycles shown in FIG. 3A. E, the phase-error 94, is shown on the second successive positive going zero crossing of wave form 62, magnified in FIG. 3C. The A to D conversion commanded at this zero crossing will measure V, a voltage level 96. Since waveform 62 is a sine function, sin(E) = V and further since E is small, sin(E) = E or V = E. Thus it may be seen that the A to D converter provides a digital representation of the phase error for small errors. The digital representation of the phase error is integrated or added to the accumulation of past phase errors, and is used to compute a period for the next expected positive going zero crossing of waveform 62. FIG. 3A shows the resumption of synchronism after two line cycles at the positive going zero crossing 98.

Under startup conditions, the phase error may be any value and hence the identity sin(x)=x may not apply, however the system will still achieve digital phase synchronization as follows. If the initial phase error measured is between ±90° the system will have negative feedback and will seek the zero crossing with positive slope (0°) as the steady state solution. If the initial phase error measured is between +90° to +270°, the system will have positive feedback which will drive the system to the ±90° region of the sine waveform.

Although FIG. 3A shows approximately three cycles of waveform 62 for every period of the timer output 81, it has been found preferable to have a period for waveform 81 of approximately 140 milliseconds. It is further to be understood that there is no necessity for synchronism or harmonic relationship between waveforms 62 and 81. The arithmetic used to schedule the next conversion is preferably performed in the same number of bits as the number of stages in timer 79, to provide for the correct computation of the scheduled time ($S_{n+1}$) of the next conversion, even when $P_n$, the computed period 100, straddles a timer overflow 90.

In a still further alternative embodiment, the proportional plus integral and inversion transfer functions 24, 28 of FIG. 1 may be performed in a digital processor (not shown), while the clock 32, counter 36 and comparator 42 functions may be accomplished by interrupt means associated with the digital processor and capable of providing a pulse upon expiration of the expected incremental time to the next zero crossing of the AC line having the same slope as represented by a digital word computed by the digital processor.

What is claimed is:

1. A digital phase synchronizer comprising:

(a) an analog-to-digital converter successively converting a voltage level of a sinusoidal input signal to a digital phase error signal upon command;

(b) a digital accumulator connected to the A to D converter for receiving and accumulating a plurality of successive digital phase error signals and providing an expected time to a future zero crossing of the sinusoidal input signal;

(c) a digital timer providing a digital time signal output incrementally representative of time; and (d) a digital comparator connected to the digital accumulator and to the digital timer comparing the expected time with the digital time signal and providing a command to the A to D converter to perform another conversion when the expected time equals the digital time signal such that the command to the A to D converter is a digital signal in phase synchronization with the sinusoidal input signal wherein the digital conversion of the voltage level by the A to D converter is directly representative of the phase error with respect to the A to D converter command.

2. The digital phase synchronizer of claim 1 wherein the digital accumulator further comprises means for algebraically inverting the accumulated digital phase error signals such that the expected time includes a calculated period of the sinusoidal input signal.

3. The digital phase synchronizer of claim 2 wherein the digital accumulator further comprises a digital transfer function having a proportional gain characteristic preceding the means for algebraically inverting.

4. The digital phase synchronizer of claim 3 wherein the transfer function of the digital accumulator still further comprises a constant term representative of a predetermined frequency.

5. The digital phase synchronizer of claim 1 wherein the digital timer further comprises a fixed stage digital counter counting pulses of a fixed frequency such that the counter has a period greater than a period of the input signal.

6. The digital phase synchronizer of claim 1 wherein the sinusoidal input signal is representative of an AC power line and the A to D converter further comprises a low-pass filter input section for providing a representation of the AC power line with high frequency noise filtered therefrom.

7. A method of providing digital phase synchronization to an AC line comprising:

(a) converting a signal proportional to an AC line voltage to a present value of a first digital signal representative thereof upon receipt of a conversion command;

(b) adding the present value of the first digital signal to an accumulation of previous values of the first digital signal and providing a second digital signal representative of a time integral function of the first digital signal;

(c) comparing the second digital signal with a digital timer signal operating from a fixed frequency source independent of the AC line; and (d) providing a signal commanding the conversion of step (a) when the digital timer signal matches the second digital signal such that the signal commanding the conversion of step (a) is a digital signal indicative of a future zero crossing of the AC line.

8. The method of claim 7 wherein step (b) further comprises algebraically inverting the accumulation of first digital signals such that the second digital signal includes a computed period of the AC line.

9. The method of claim 7 wherein step (b) further comprises adding a scaled proportion of the present value of the first digital signal to the accumulation of first digital signals such that the second digital signal is representative of a proportional plus integral function of the first digital signal.

10. The method of claim 7 wherein the first digital signal in step (a) is representative of a phase difference between a zero crossing of the AC line and receipt of the conversion command for the present value of the first digital signal.

11. The method of claim 7 wherein the digital timer signal has a period greater than a period of the AC line.

12. In combination with a microcontroller of the type having:
  i. a digital microprocessor,
  ii. a high frequency clock
  iii. an A to D converter,
  iv. a content addressable memory capable of storing a plurality of events with each event having an associated time stored therewith,
  v. a fixed stage free-running timer incremented by the high frequency clock, and
  vi. a comparator for causing a specified event to occur when the associated time matches a present value of the timer, an improvement in combination therewith of a method of providing digital phase synchronization to an AC line which comprises:

(a) retaining the present value of the timer as a timer offset value in response to a conversion command;

(b) performing an A to D conversion on the AC line in response to the conversion command to obtain a present value of an AC line;

(c) storing the present value of the AC line as a present value of a phase error in the digital microprocessor;

(d) integrating the present and a plurality of past values of phase error in the digital microprocessor as a first intermediate result;

(e) algebraically inverting the first intermediate result in the digital microprocessor as a second intermediate result;

(f) storing a summation of the timer offset value and the second intermediate result in the content addressable memory as an associated time for a next conversion command; and (g) providing a digital signal synchronized to a zero-crossing of the AC line at each associated time of successive conversion commands.

13. The method of claim 12 wherein step (d) further comprises adding a proportional amount of the present value of the phase error to the result of the integration of step (d).

14. The method of claim 13 wherein step (d) still further comprises adding a constant value representative of a predetermined frequency near a nominal frequency of the AC line to the result obtained in step (d).

15. A digital AC line phase synchronizer comprising:

(a) an analog to digital converter means having a signal input and a strobe input, said signal input connected to a signal representative of an AC power line for providing a digital output representative of said AC power line in a region of a present zero crossing of said AC power line upon receipt of a strobe command at said strobe input;

(b) a parallel-bit digital processor means having an input connected to the output of said converter means for providing a digitally computed proportional plus integral transfer function, the digital processor means further having a digital output word indicative of an expected time of a next zero crossing of the AC power line having a same slope as the present zero crossing; and (c) interrupt means having an input connected to said digital processor means for accepting said digital word as an input and having an output for providing a pulse at the expected time indicated by said digital word;

wherein said interrupt means output causes a strobe command to be presented to the strobe input of said analog to digital converter means to commence a new analog to digital conversion such that said interrupt means output is a digital signal synchronized to the AC power line.

* * * * *